United States Patent
Friesinger et al.

(10) Patent No.: US 12,130,351 B2
(45) Date of Patent: Oct. 29, 2024

(54) CALIBRATION UNIT, CALIBRATION SYSTEM AND CALIBRATION METHOD FOR A VECTOR NETWORK ANALYZER

(71) Applicant: Rohde & Schwarz GmbH & Co. KG, Munich (DE)

(72) Inventors: Maximilian Friesinger, Munich (DE); Thilo Bednorz, Erding (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 239 days.

(21) Appl. No.: 17/836,649

(22) Filed: Jun. 9, 2022

(65) Prior Publication Data

US 2023/0408617 A1 Dec. 21, 2023

(51) Int. Cl.
*G01R 35/00* (2006.01)
*G01R 35/02* (2006.01)

(52) U.S. Cl.
CPC .......... *G01R 35/007* (2013.01); *G01R 35/02* (2013.01)

(58) Field of Classification Search
CPC .............................. G01R 35/007; G01R 35/02
See application file for complete search history.

(56) References Cited

U.S. PATENT DOCUMENTS

| | | | |
|---|---|---|---|
| 5,442,296 A * | 8/1995 | Schiek | G01R 35/005 702/85 |
| 5,578,932 A | 11/1996 | Adamian | |
| 7,030,625 B1 | 4/2006 | Boudiaf et al. | |
| 7,034,548 B2 | 4/2006 | Anderson | |
| 10,469,333 B2 * | 11/2019 | Leibfritz | H04L 41/24 |
| 2010/0102829 A1 * | 4/2010 | Azarian | G01R 27/08 324/651 |
| 2012/0109566 A1 * | 5/2012 | Adamian | G01R 35/005 702/107 |

* cited by examiner

*Primary Examiner* — Reena Aurora
(74) *Attorney, Agent, or Firm* — DITTHAVONG, STEINER & MLOTKOWSKI

(57) ABSTRACT

The present disclosure relates to a calibration unit for a vector network analyzer (VNA). The calibration unit comprises a calibration circuit which is configured to provide the calibration standards open, short and match; and an isolation circuit. The calibration circuit comprises a first port which is arranged for being connected to a port of the VNA, a second port which is arranged for being connected to a device-under-test (DUT), and a third port which is connected to a first port of the isolation circuit; and the isolation circuit comprises a second port which is arranged for being connected to one or more further calibration units.

17 Claims, 8 Drawing Sheets

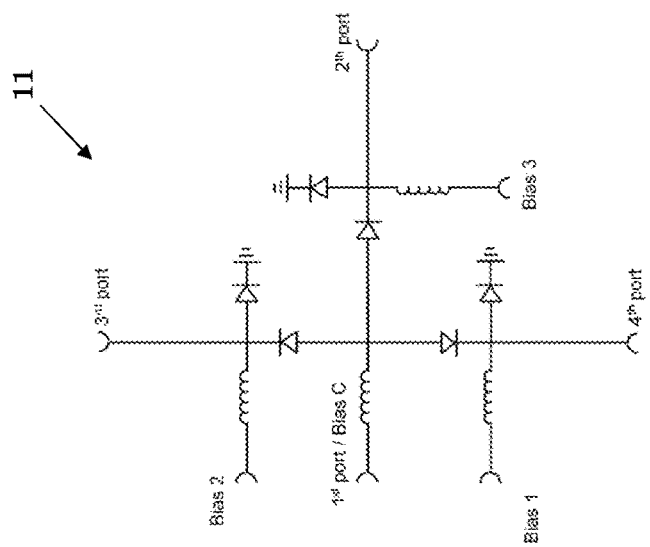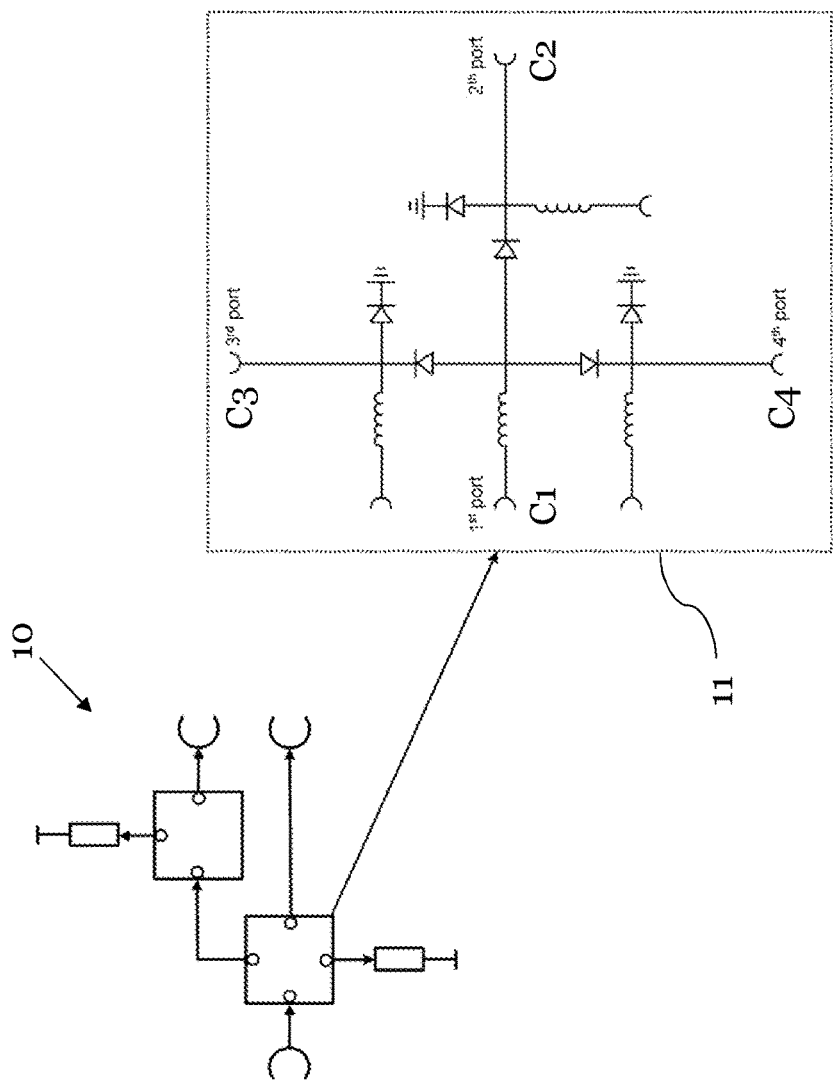
Fig. 7A
Fig. 7B

CALIBRATION UNIT, CALIBRATION SYSTEM AND CALIBRATION METHOD FOR A VECTOR NETWORK ANALYZER

TECHNICAL FIELD

Generally, the disclosure relates to the calibration of vector network analyzers (VNAs). More specifically, the disclosure relates a calibration unit, a calibration system and a calibration method for a vector network analyzer.

BACKGROUND ART

A vector network analyzer (VNA) is a device for measuring the RF performance of a radio frequency device-under-test (DUT). The VNA can be used to characterize scattering parameters (S parameters) of the DUT.

Measurements with a VNA typically require a high accuracy and repeatability. However, different types of errors during such measurements can cause inaccuracies in the amplitude and phase of the measurement signals. For instance, systematic errors caused by non-ideal components in a VNA measurement setup, e.g. cable loss or impedance mismatch, can influence the measurement results.

Such errors can be removed or mitigated by means of calibration. For instance, calibration units can be used to connect calibration standards at appropriate points in the measurement setup. A calibration routine can be carried out with the connected standards and the resulting calibration data can be used to correct recorded signals in a later measurement with the DUT. Such calibration measurements are typically performed over a specific temperature range.

In some calibration setups, a plurality of calibration units are connected to the DUT. To perform certain calibration measurements, such as transmission tracking and load match measurements, two calibration units are disconnected from the DUT and directly connected to each other before a temperature cycle of the DUT. The path between the two calibration units should thereby be reciprocal which means that the amplitude and phase has to be the same for a signal going from the first calibration unit to the second calibration unit and vice versa, i.e. the measurement in both directions should have the same amplitude and phase.

Thus, when performing a full calibration routine, the wiring between the devices needs to be changed manually at some point during the routine. However, removing the wiring during calibration and adding the wiring again takes a lot of time. Furthermore, the connectors wear down sooner and, thus, have to be replaced sooner.

In addition, depending on the number of DUT ports, the disconnecting process can take a lot of time. The more DUT ports, the higher the effort. Furthermore, the calibration is performed over a wide frequency band, e.g. several 10 GHz. If the resolution is small, each calibration measurement can take a lot of time.

SUMMARY

Thus, there is a need to provide an improved calibration unit, an improved calibration system and an improved calibration method for a VNA which avoid the above-mentioned disadvantages. In particular, there is a need to perform a VNA calibration routine that does not require to change connections between devices during the routine.

These and other objectives are achieved by the embodiments provided in the enclosed independent claims. Advantageous implementations of the present disclosure are further defined in the dependent claims.

According to a first aspect, the present disclosure relates to a calibration unit for a vector network analyzer (VNA), comprising: a calibration circuit which is configured to provide the calibration standards open, short and match; and an isolation circuit. The calibration circuit comprises a first port which is arranged for being connected to a port of the VNA, a second port which is arranged for being connected to a device-under-test (DUT), and a third port which is connected to a first port of the isolation circuit; wherein the isolation circuit comprises a second port which is arranged for being connected to one or more further calibration units.

This achieves the advantage that a calibration routine comprising various calibration measurements, including transmission tracking and load match measurements, can be performed without needing to disconnect and reconnect the calibration unit from the DUT for some of these measurements. In particular, it is not necessary to reconnect the DUT at room temperature when performing transmission tracking and/or load match measurements. Thus, the calibration time can be reduced resulting in a higher throughput for a user.

The calibration unit can be configured to perform a measurement calibration of the VNA and/or of a measurement setup comprising the VNA. The measurement setup, for instance, comprises further elements, such as cables, connectors and/or attenuators, for connecting the VNA to the DUT. By means of such a measurement calibration, systematic errors in the measurement setup can be removed. For instance, such a calibration with the calibration unit can be carried out once a day or once a week.

The calibration routine can comprise an OSM (open, short match) calibration, a transmission tracking and/or a load match calibration. During such a calibration routine, the VNA can record calibration data. The VNA can be calibrated based on this calibration data.

Each of the one or more further calibration units can be of the same type. For instance, the third port of the calibration unit can be directly connected to a suitable port of a further calibration unit of same type (e.g., a second port of an isolation circuit of the further calibration unit). However, the third port of the calibration unit can also indirectly be connected to a suitable port of a further calibration unit. For instance, an additional connecting device, e.g. a switch matrix or a distribution unit, can be connected between the third port of the calibration unit and the port of the further calibration unit.

In particular, the VNA, the DUT and the one or more further calibration units are external elements that are connectable to the calibration unit. The various connections between the devices and units can be wired connections.

The calibration circuit being configured to provide the calibration standards may refer to the calibration circuit being configured to selectively apply the calibration standards to the VNA, in particular to the VNA port via the first port of the calibration circuit. Preferably, the calibration circuit can be configured to generate the calibration standards, e.g. by a targeted operation of internal switches and/or by applying voltage biases at different terminals in the calibration circuit. For instance, for providing the short calibration standard, the calibration circuit is configured to short its first port; for providing the open calibration standard, the calibration circuit is configured to leave its first port open; and for providing the match calibration standard, the calibration circuit is configured to add a load (e.g., 50 ohm) to its first port.

The calibration circuit and the isolation circuit can each comprise a switching unit. The switching unit can comprise an SP3T switch (single pole three-way throw switch). The calibration unit can selectively connect different ports of the calibration circuit and the isolation circuit to each other and to the VNA by means of the switching unit.

The calibration unit can be an inline calibration unit. The second port of the calibration circuit can be connectable to a suitable port of the DUT.

The calibration unit and the at least one further calibration unit can form a calibration system for the VNA. This calibration system can comprise at least two calibration units according to the first aspect of the disclosure that are connected to each other via the second ports of their respective isolation circuits and that are connected to respective DUT ports via the second port of their respective calibration circuits. The system can further comprise the VNA.

In an embodiment, the calibration unit is configured to connect the first port of the calibration circuit to the second port of the isolation circuit in order to perform a transmission tracking and/or a load match measurement.

In this case, the VNA (that is connected to the first port of the calibration circuit) is electrically connected to the second port of the isolation circuit which is connected to at least one further calibration unit.

In an embodiment, the calibration circuit comprises a fourth port which is connected to a matched load, especially to a match calibration standard. In this way, the calibration unit can provide the match calibration standard for performing a match calibration measurement.

In particular, the calibration unit can comprise the matched load connected to its fourth port. For instance, the matched load is 50 ohm.

In an embodiment, the isolation circuit comprises a third port which is connected to a matched load. The matched load can be a termination load and/or a match calibration standard, for instance 50 ohm. In particular, the calibration unit can comprise the matched load.

For instance, the isolation between the second port and the first port of the isolation circuit can be increased by the load. Thus, if the "through" connection between two calibration units is not used (the cable is still connected) any influence from that cable can be minimized by the third port being connected to the termination load. Thus, the feedback to the calibration circuit is minimized without needing to disconnect the calibration units from each other.

In an embodiment, the calibration unit is configured to connect the first port of the calibration circuit to the short calibration standard, the open calibration standard, the match calibration standard, or the DUT; wherein the calibration unit is configured to disconnect the first port of the isolation circuit from the second port of the isolation circuit.

This provides the advantage that the feedback from the second port of the isolation circuit towards the calibration circuit is minimized while performing an OSM calibration or while performing a measurement with the DUT.

In an embodiment, the calibration unit is configured to connect the first port of the isolation circuit to the third port of the isolation circuit.

This provides the advantage that the feedback from the second port of the isolation circuit towards the calibration circuit can be minimized. In particular, the first port of the isolation circuit is connected with the load of the isolation circuit by means of this connection.

In an embodiment, the calibration unit is configured to connect the first port of the calibration circuit to the second port of the calibration circuit; wherein the calibration unit is further configured to connect the first port of the isolation circuit to the third port of the isolation circuit.

This achieves the advantage that, while the VNA is connected to the DUT via the calibration circuit, the load of the isolation circuit is connected to the first port of the isolation circuit in order to disconnect the trough port of the isolation circuit from the first port and, thus, to increase the isolation. The same can be done for each of the one or more further calibration units. Thus, the calibration unit(s) can stay connected to the VNA and the DUT when the VNA performs its measurements with the DUT.

In an embodiment, the calibration unit further comprises a distribution unit; wherein the distribution unit comprises a first port which is connected to the second port of the isolation circuit; and wherein the distribution unit comprises at least a second and a third port; wherein the second port of the distribution unit is arranged for being connected to a first further calibration unit; and wherein the third port of the distribution unit is arranged for being connected to a second further calibration unit.

This achieves the advantage that the second port of the isolation circuit can be split up to a plurality of through ports. As such, the calibration unit can be connected to two or more further calibration units, in particular two or more further calibration units of the same type.

In particular, the second port of the distribution unit is connectable to a second port of a distribution unit of the first further calibration unit; and the third port of the distribution unit is connectable to a third port of a distribution unit of the second further calibration unit.

In an embodiment, the distribution unit comprises at least N ports, wherein N is the number of ports of the VNA. For example, the distribution unit and the VNA can have four respective ports.

In an embodiment, the at least N ports of the distribution unit comprise the first port which is connected to the second port of the isolation circuit, and N−1 further ports which are each arranged for being connected to a respective further calibration unit.

In particular, one port of the N ports of the distribution unit is connected to the calibration unit and the remaining N−1 ports of the distribution unit are each connectable to a port of a respective distribution unit of one of N−1 further calibration units. Thus, each of the N ports of the distribution unit is connected to a respective calibration unit. For instance, if the VNA has four ports, a measurement setup for calibration can comprise four calibration units of the same type, each calibration unit connected to one VNA port.

In an embodiment, the calibration unit further comprises a switch matrix; wherein the switch matrix has N ports, wherein N is the number of ports of the VNA; wherein a first port of the switch matrix is connected to the second port of the isolation circuit; and wherein the remaining ports of the switch matrix are arranged for being connected to the one or more further calibration units.

The switch matrix can be used instead of the distribution unit. In particular, the remaining N−1 ports of the switch matrix are connected to respective second ports of isolation circuits of the one or more further calibration units.

According to a second aspect, the present disclosure relates to a calibration system for a VNA, wherein the VNA has N ports. The calibration system comprises: N calibration units according to the first aspect of the disclosure, wherein: a) the first port of the calibration circuit of each of the N calibration units is arranged for being connected to one of the N ports of the VNA, b) the second port of the calibration circuit of each of the N calibration units is arranged for being connected to the DUT, and c) the third port of the calibration circuit of each of the N calibration units is connected to the first port of the respective isolation circuit of the calibration unit.

In particular, the second port of the calibration circuit of each of the N calibration units is arranged for being connected to a respective port of the DUT.

The calibration system can further comprise the VNA.

In an embodiment, each of the N calibration units comprises a distribution unit; wherein each distribution unit comprises a first port which is connected to the second port of the isolation circuit of the respective calibration unit; and wherein each distribution unit comprises at least a second and a third port via which the distribution unit is connected to the distribution units of two further calibration units of the N calibration units; wherein the distribution units of the N calibration units are connected to each other in a ring like structure.

In particular, all calibration units are connected to each other in a ring-like manner spanned by the respective distribution units. The ring can be closed at the end or left open. In case the ring is closed, all distribution units may comprise at least three ports. In case the ring is open, the first and the last distribution unit may only comprise two ports. In that case, they may only be connected to one other distribution unit.

According to a third aspect, the present disclosure relates to a set comprising a VNA and the calibration system according to the second aspect of the disclosure, wherein the calibration system is configured to control each of the N calibration units in such a way that each calibration unit subsequently connects the calibration standards open, short and match to a respective port of the VNA; wherein the VNA is configured to conduct a respective measurement for each calibration standard connected to a respective port of the VNA, wherein the measurements with each calibration standard are conducted simultaneously for all ports of the VNA.

For instance, each calibration unit subsequently connects the calibration standards short, open and match provided by their respective calibration circuit to a port of the VNA. The calibration standards can be connected in any order to the respective ports, however, preferably each calibration unit uses the same order.

In particular, the set comprising the VNA and the calibration system can form another system, e.g. a calibration measurement system.

In an embodiment, the calibration system is configured to connect the ports of the VNA pairwise together by means of the respective calibration units; wherein the VNA is configured to conduct respective transmission track and/or load match measurements.

According to a fourth aspect, the present disclosure relates to a calibration method for a vector network analyzer (VNA), wherein the VNA comprises a number of ports. The calibration method comprises the steps of:
  connecting each port of the VNA to a respective calibration unit;
  connecting each calibration unit to a device-under-test (DUT);
  connecting the calibration units to each other; and
  conducting calibration measurements with at least one of the calibration standards short, open and match simultaneously for each port of the VNA.

In particular, each of the calibration units that is connected to a VNA port can be a calibration unit according to the first aspect of the disclosure.

In an embodiment, the calibration method comprises the further steps of:
  connecting the ports of the VNA pairwise together by means of the respective calibration units; and
  conducting respective transmission tracking and/or load match measurements.

In particular, the transmission tracking and/or load match measurements can be carried out at least in part simultaneously for each port of the VNA.

The above description with regard to calibration unit according to the first aspect of the disclosure is correspondingly valid for the calibration system according to the second aspect of the disclosure, the set according to the third aspect of the disclosure and the calibration method according to the fourth aspect of the disclosure.

BRIEF DESCRIPTION OF THE DRAWINGS

The above described aspects and implementation forms of the present disclosure will be explained in the following description of specific embodiments in relation to the enclosed drawings, in which:

FIGS. 7A-B show schematic diagrams of a calibration unit for a VNA according to an embodiment of this disclosure.

DETAILED DESCRIPTIONS OF EMBODIMENTS

Figure 1:
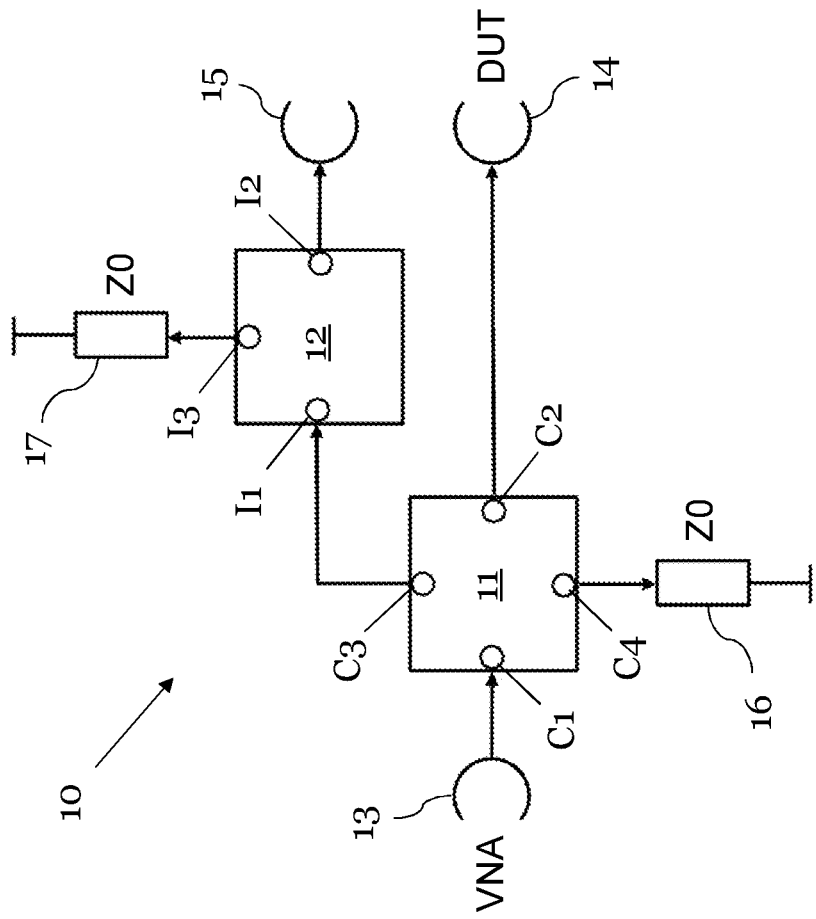
FIG. 1 shows a schematic diagram of a calibration unit for a VNA according to an embodiment of this disclosure.

FIG. 1 shows a calibration unit 10 for a VNA according to an embodiment. The VNA comprises at least one port 13.

The calibration unit 10 comprises a calibration circuit 11 which is configured to provide the calibration standards open, short and match, and an isolation circuit 12. The calibration circuit 11 comprises a first port C1 which is arranged for being connected to the port 13 of the VNA, a second port C2 which is arranged for being connected to a DUT, and a third port C3 which is connected to a first port I1 of the isolation circuit 12. The isolation circuit 12 comprises a second port I2 which is arranged for being connected to one or more further calibration units.

The calibration circuit 11 can be configured to selectively provide the open, short and match calibration standards to the VNA, e.g. to generate the standards and to connect them to the VNA port 13 via the first port C1. For instance, for providing the short calibration standard, the calibration circuit 11 is configured to short its first port C1; for providing the open calibration standard, the calibration circuit 11 is configured to leave its first port C1 open; and for providing the match calibration standard, the calibration circuit is configured to add a matched load 16 (e.g., 50 ohm) to its first port. The matched load 16 can be connected to a fourth port C4 of the calibration circuit 11.

The calibration unit 10 can be an automatic calibration unit which is configured to automatically switch between the different calibration standards during a calibration routine of the VNA.

The calibration circuit 11 and the isolation circuit 12 can each comprise a switching unit. The respective switching units can each comprise a SP3T (single pole three-way throw) switch. The switching units can be configured to establish connections between respective ports C1-C4, I1-I3 of the calibration circuit 11 and the isolation circuit 12, to generate the calibration standards, and/or to connect the calibration standards to the VNA port 13, depending on which measurement is to be performed.

For instance, the switching unit of the calibration circuit 11 can provide a connection between the VNA port 13 and the DUT port 14. Furthermore, it can generate and/or provide the open, short and match standards to the VNA port 13, e.g. for an OSM calibration at the DUT port 14. In particular, a calibrated VNA with the reference plane at the DUT port 14 can be used to measure the open, short and match state of the measurement setup.

The second port I2 of the isolation circuit 12 can be connected to a through port 15, e.g. a port of a further calibration unit or an intermediate port. The through port 15 can be connected to a cable or can be open. The isolation circuit 12 can be configured to isolate the through port 15 from the calibration circuit 11.

The calibration unit 10, in particular the switching unit of the calibration unit 10, can be configured to connect the first port C1 of the calibration circuit 11 to the short calibration standard, the open calibration standard, the match calibration standard, or to the DUT. At the same time, the calibration unit 10 can be configured to disconnect the first port I1 of the isolation circuit from the second port of the isolation circuit I2. In this way, feedback from the second port of the isolation circuit 12 (e.g., from the through port 15) towards the calibration circuit 11 can be minimized.

The isolation circuit 12 can comprise a third port I3 which is connected to a matched load 17. For instance, the isolation between the second port and the first port of the isolation circuit can be increased by the matched load 17. The matched load 17 may comprise a match calibration standard, e.g. 50 ohm.

The calibration unit 10 can form a calibration device which has a housing, wherein the calibration circuit 11 and the isolation circuit 12 are arranged in the housing. The various ports of the calibration circuit 11 and the isolation circuit 12 can be arranged on the housing. In an example, the calibration unit 10 can further comprise a communication interface for exchanging communication data, e.g. with the VNA or another device. The calibration unit 10 can comprise a processing unit for controlling the calibration and isolation circuit, in particular their switching units, during a calibration routine, e.g. based control commands stored in a memory of the calibration unit 10 or received from the VNA.

The DUT can be a radio frequency (RF) device, e.g. an antenna, a radio device, a transmission device. The VNA can be calibrated based on calibration data that is recorded during the different calibration measurements with the various calibration standards.

Figure 2:
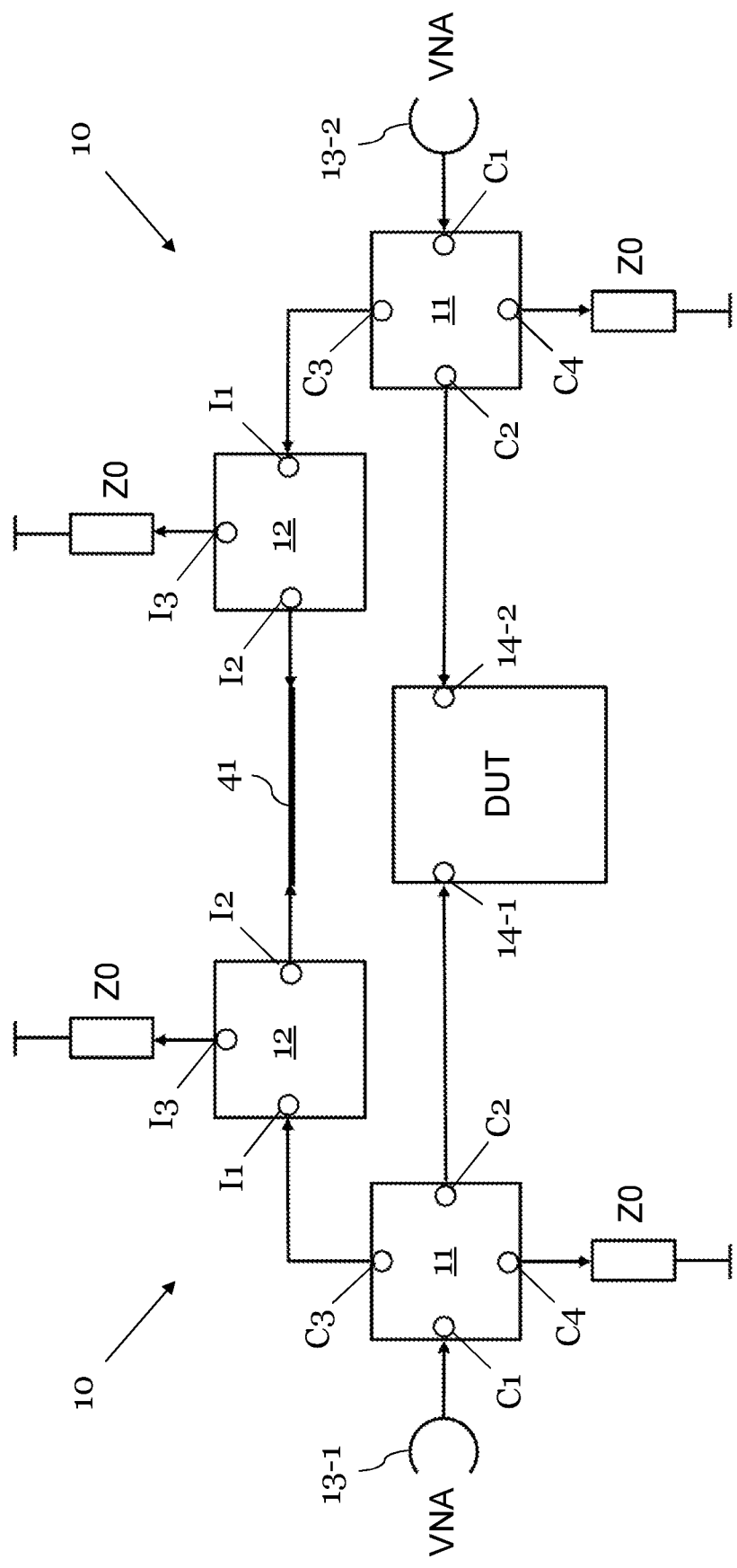
FIG. 2 shows a schematic diagram of a calibration system for a VNA according to an embodiment of this disclosure.

FIG. 2 shows a schematic diagram of a system comprising two calibration units 10 connected to a DUT according to an embodiment.

Both calibration units 10 in the system shown in FIG. 2 can be of the same type shown in FIG. 1 and can be connected to each other via the second ports I2 of their respective isolation circuits. An inexpensive cable 41 can be used for this connection. Furthermore, the second ports C2 of the respective calibration circuits 11 of the calibration units 10 can be connected to different DUT ports 14-1, 14-2.

In this way, separate connections can be achieved for obtaining transmission tracking data and load match data. For instance, the respective isolation circuits 12 connect their first and second ports I1, I2 for calibration, wherein the calibration circuits 11 connect their respective first and third ports C1, C3. In this way, a connection between the VNA ports 13-1, 13-2 that does not pass through the DUT can be established via the calibration units 10. With this connection, transmission tracking and/or load match measurements can be carried out.

If this direct connection between the two calibration units 10 is not needed, the isolation circuits can connect their first ports I1 to their third ports I3, thereby increasing the isolation between the first and second ports I1, I2.

In another example, the calibration unit 10 is configured to connect the first port C1 and second port C2 of the calibration circuit 11, and to connect the first port I1 and the third port I3 of the isolation circuit. In this way, the feedback from the second port of the isolation circuit towards the calibration circuit can be minimized while the VNA is connected to the DUT. Thus, the calibration unit(s) can stay connected to the VNA and the DUT when the VNA performs its measurements with the DUT.

For instance, for each port 14-1, 14-2 of the DUT one calibration unit 10 is preferably used.

The DUT can be arranged in a climate cell in to simulate various temperature profiles. In that case, the calibration units 10 are also arranged within the climate cell, or the calibration units 10 are arranged outside the climate cell With the system shown in FIG. 2, directivity, reflection tracking, source match, transmission tracking and load match measurements can be refreshed during a temperature cycle of the DUT without needing to change any connections between the calibration units 10 and the DUT or the VNA. This enables a user to perform a systematic error correction, e.g. an E-term correction on a two port and/or a UOSM calibration routine, over a specified temperature range. No additional connection steps must be made once the measurement setup in FIG. 2 is set up, which is particularly advantageous if the DUT is arranged in a climate cell.

Figure 3:
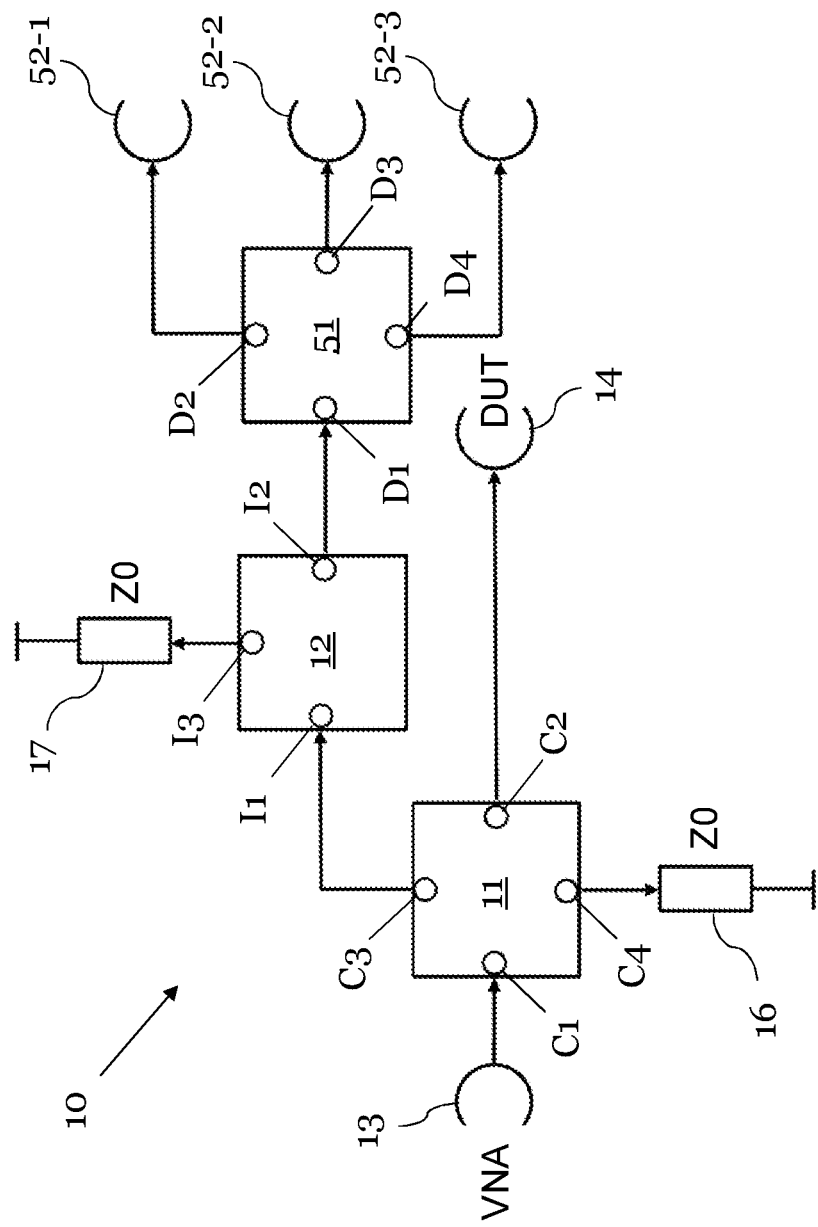
FIG. 3 shows a schematic diagram of a calibration unit for a VNA according to an embodiment of this disclosure.

FIG. 3 shows the calibration unit 10 for the VNA according to an embodiment.

The calibration unit 10 shown in FIG. 3 comprises a distribution unit 51. The distribution unit 51 can be configured to split up the second port I2 of the isolation circuit 12 to two or more than two ports (in example shown in FIG. 3 to three ports). This allows the calibration unit 10 to be connected to a plurality of other calibration units 10.

The distribution unit 51 can comprise a number of ports D1-D4. A first port D1 can be connected to the second port I2 of the isolation circuit 12. Each of the further ports D2-D4 can be connectable to a further calibration unit.

For instance, the distribution unit 51 can comprise N ports, wherein N is the number of ports of the VNA. Each of these N ports of the distribution unit 51 can be connectable to a respective calibrating unit, e.g. the first port D1 is connected to the calibration unit 10 and the remaining ports D2-D4 are connected to respective further calibration units.

With the topology shown in FIG. 3, a four-port error correction can be performed. This is achieved by the distribution unit 51 which can route the VNA port 13 to three different VNA ports 52-1, 52-2, 52-3 (e.g., via further calibration units not shown in FIG. 3) providing the necessary three unknowns for a system error correction algorithm.

Figure 4:
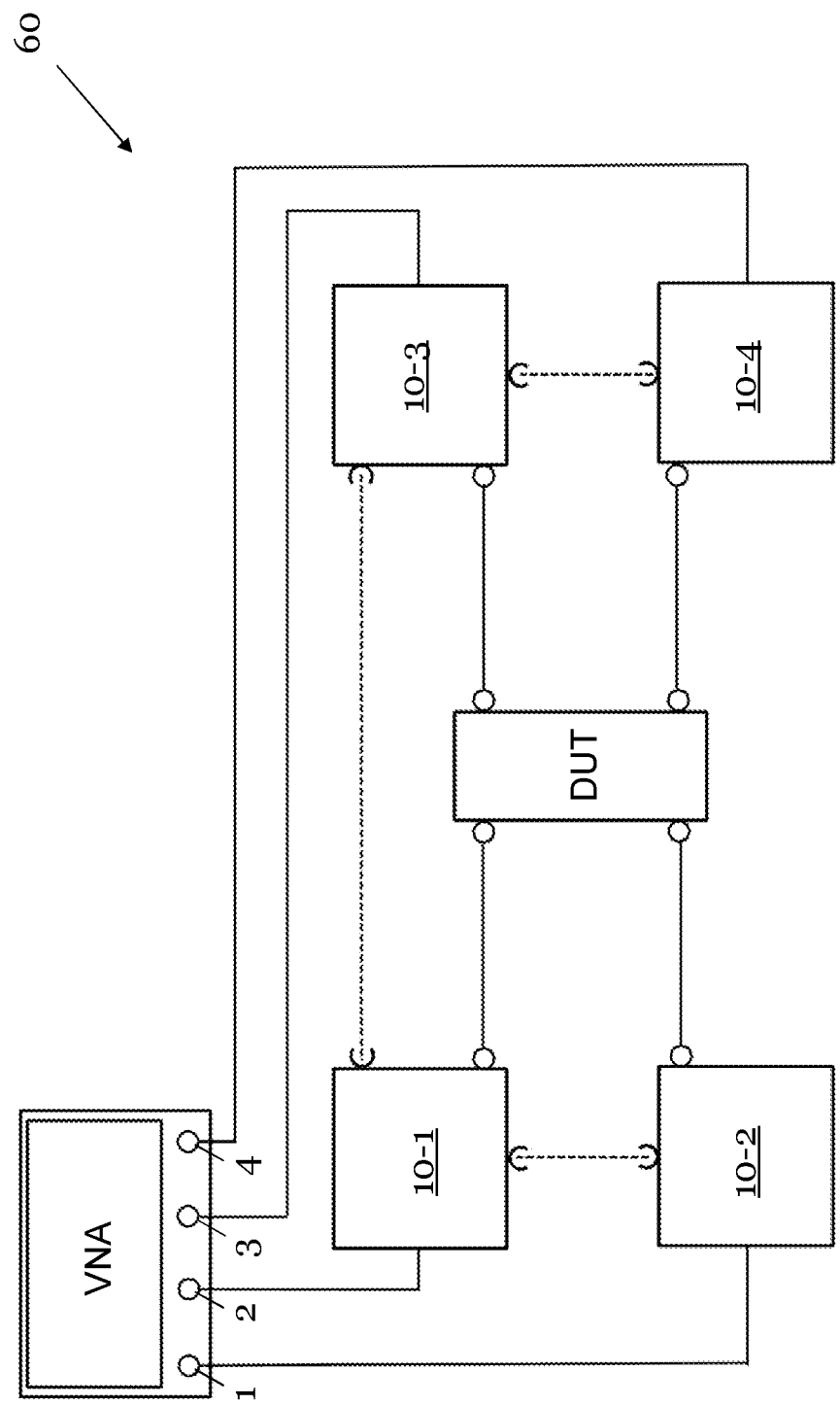
FIG. 4 shows a schematic diagram of a calibration system for a VNA according to an embodiment of this disclosure.

FIG. 4 shows a schematic diagram of a calibration system 60 for a VNA according to an embodiment.

The system 60 can comprise one calibration unit for each of the N ports of the VNA. For instance, in FIG. 4 the VNA has four ports and, thus, the system 60 has four calibration units 10-1, . . . , 10-4. The calibration units 10-1, . . . , 10-4 of the system 60 can be calibration units 10 as shown in one of FIG. 1, 3, 6 or 7A-B.

For example, the first port C1 of the calibration circuit 11 of each of the calibration units 10-1, . . . , 10-4 is arranged for being connected to one of the ports of the VNA, the second port C2 of the calibration circuit 11 of each of the calibration units 10-1, . . . , 10-4 is arranged for being connected to the DUT, and the third port C3 of the calibration circuit of each of the calibration units 10-1, . . . , 10-4 is connected to the first port I1 of the respective isolation circuit of the calibration unit.

Each calibration unit 10-1, . . . , 10-4 of the system 60 can comprise a distribution unit 51 such that each calibration unit 10-1, . . . , 10-4 can be connected to at least two other calibration units 10-1, . . . , 10-4. For calibration, it might not be necessary that each calibration unit 10-1, . . . , 10-4 is connected to all other remaining calibration units 10-1, . . . , 10-4. However, this can achieve the best results. In general, it can be sufficient if each calibration unit 10 is connected to all other remaining calibration units 10-1, . . . , 10-4 though one or more calibration unit 10 (circle connection). In other words, the distribution units 51 of the calibration units 10-1, . . . , 10-4 can be connected to each other in a ring like arrangement.

For example, the calibration unit 10-1 is not directly connected to the calibration unit 10-4. However, the transmission tracking and load match data between calibration unit 10-1 and calibration unit 10-2 can be calculated from the already obtained data.

The VNA and the calibration units 10-1, . . . , 10-4 can form a set. The set can also comprise the DUT.

The calibration system 60 can be configured to control each of the calibration units 10-1, . . . , 10-4 in such a way that a respective calibration unit connects the calibration standards short, open, and match subsequently to the respective port of the VNA. The VNA can be configured to conduct a measurement with the respective calibration standard connected to the respective port. The measurements for each connected standard can be carried out for all ports simultaneously. I.e., each port of the VNA can be connected to the same calibration standard and a respective calibration measurement with this standard can be carried out simultaneously for all ports. Then all VNA ports are connected to another calibration standard and calibration measurements are simultaneously carried out with this standard.

Furthermore, the calibration system 60 can be configured to connect the ports of the VNA pairwise together via the respective calibration units 10-1, . . . , 10-4, wherein the VNA is configured to conduct respective transmission track and/or load match measurements. For example, VNA port 1 and VNA port 2 are connected, and VNA port 3 and VNA port 4 are connected, wherein a measurement from VNA port 1 to VNA port 2 are carried out simultaneously to a measurement from VNA port 3 to VNA port 4. Subsequently, a measurement from VNA port 2 to VNA port 1 can be carried out simultaneously to a measurement from VNA port 4 to VNA port 3.

Figure 5:
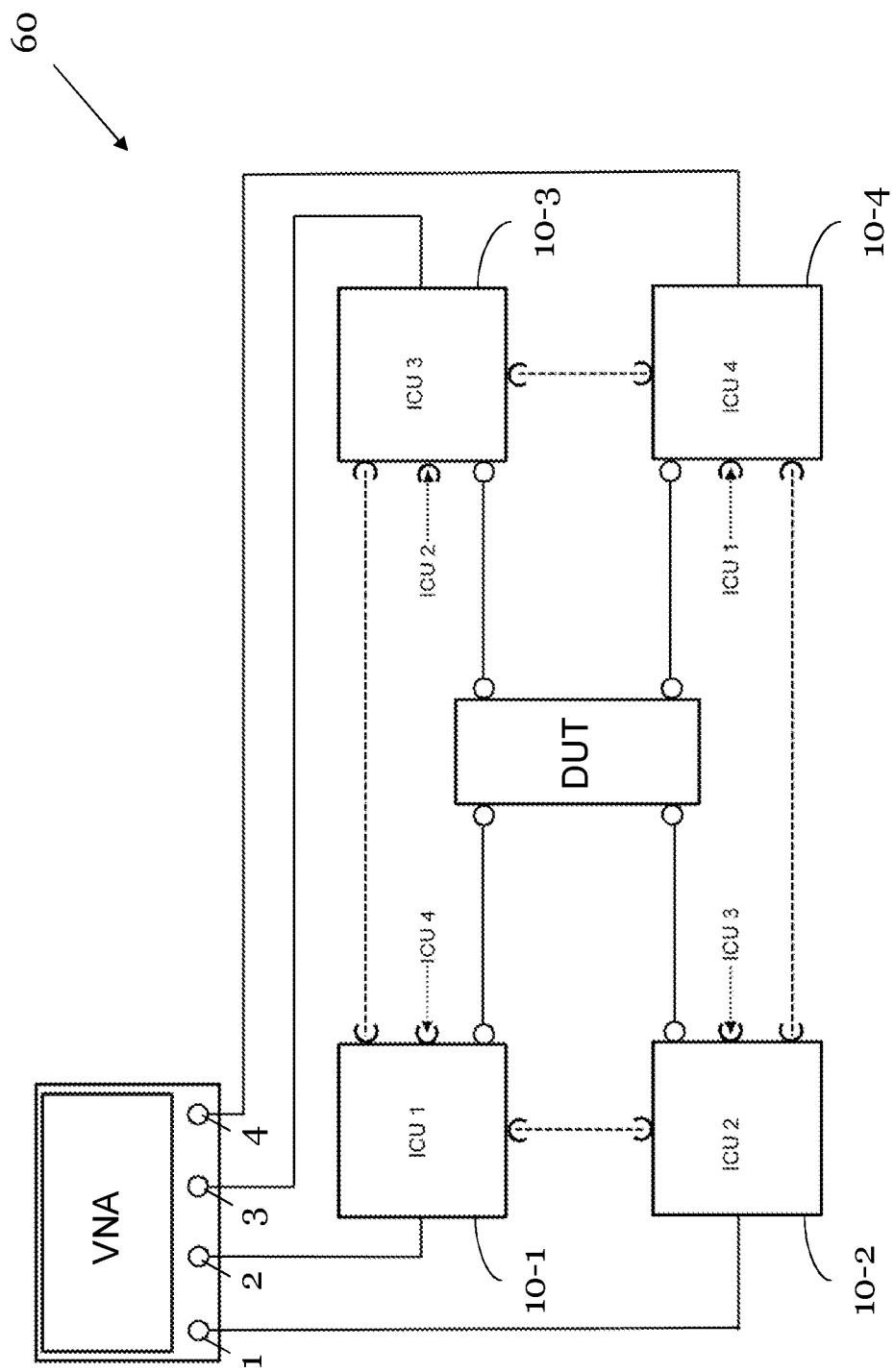
FIG. 5 shows a schematic diagram of a calibration system for a VNA according to an embodiment of this disclosure.

FIG. 5 shows the system 60 according to an embodiment, where all calibration units 10-1, . . . 10-4 are connected to all other remaining calibration units. For instance, calibration unit 10-1 is connected to calibration units 10-2, 10-3 and 10-4.

Figure 6:
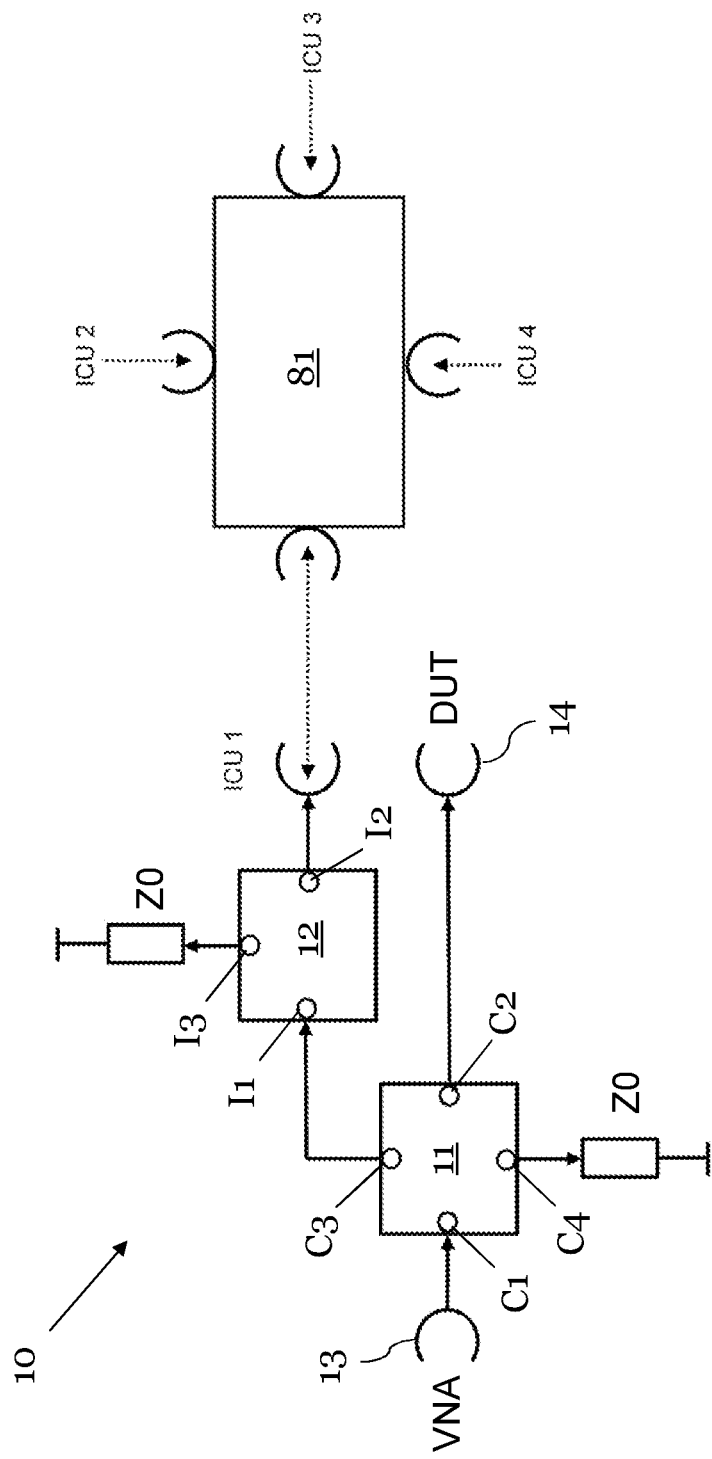
FIG. 6 shows a schematic diagram of a calibration unit for a VNA according to an embodiment of this disclosure.

FIG. 6 shows a schematic diagram of the calibration unit 10 according to an embodiment.

The calibration unit 10 shown in FIG. 6 comprises a switch matrix 81. The switch matrix 81 can comprise at least one port for each calibration unit 10 that is connected to the VNA. The matrix 81 can have N ports, wherein N is the number of ports of the VNA and/or the number of calibration units 10 connected to the VNA. For example, if four calibration units 10 are used, then the switch matrix 81 has four ports.

The switch matrix 81 can be configured to connect each VNA port to each remaining port. Preferably this can be done simultaneously. For example, VNA port 1 can be connected to VNA port 2. And at the same time VNA port 3 can be connected to VNA port 4. However, it is also possible that this is done sequentially.

For instance, a first port of the switch matrix 81 can be connected to the second port 12 of the isolation circuit 12 of the calibration unit 10 and the remaining ports of the switch matrix 81 can be connected to further calibration units 10 (as shown in FIG. 5).

The switch matrix 81 can be used instead of the distribution unit 51 shown in FIG. 3.

FIGS. 7A-B show schematic diagrams of the calibration unit 10 according to an embodiment. In particular, FIGS. 7A and 7B show a possible circuit diagram of the calibration circuit 11.

The calibration circuit 11 can comprise PIN diodes which are used as switches. Depending on the bias voltage at different terminals of the circuit, the first port C1 of the calibration circuit 11 is connected to none of the other ports (open) or to port C2, C3 or C4.

FIG. 7B shows an example how the calibration standards open and short can be generated by the calibration circuit 11 and provided to the VNA. For instance, to generate a short calibration standard at the first port C1 of the isolation circuit 11, the bias C is set to 0V, the bias 1 is set to 12 V, the bias 2 is set to 12 V and the bias 3 is set to 12V. To generate an open calibration standard at the first port C1 of the isolation circuit, the bias C is set to 0V, the bias 1 is set to −12 V, the bias 2 is set to 12 V and the bias 3 is set to 12V.

Performing a calibration measurement with each calibration standard can comprise: sending an RF signal to the first port C1 of the calibration circuit 11 by means of the VNA and analyzing a response signal received at the same or a different VNA port (depending on the standard and/or the calibration measurement).

The calibration circuit 11 can be integrated in a chip. The isolation circuit 12 can also be integrated in a chip or in the chip of the calibration circuit 11. The distribution unit 51 can also be integrated in a chip or in the chip of the calibration circuit 11 and/or in the chip of the isolation circuit 12.

Figure 8:
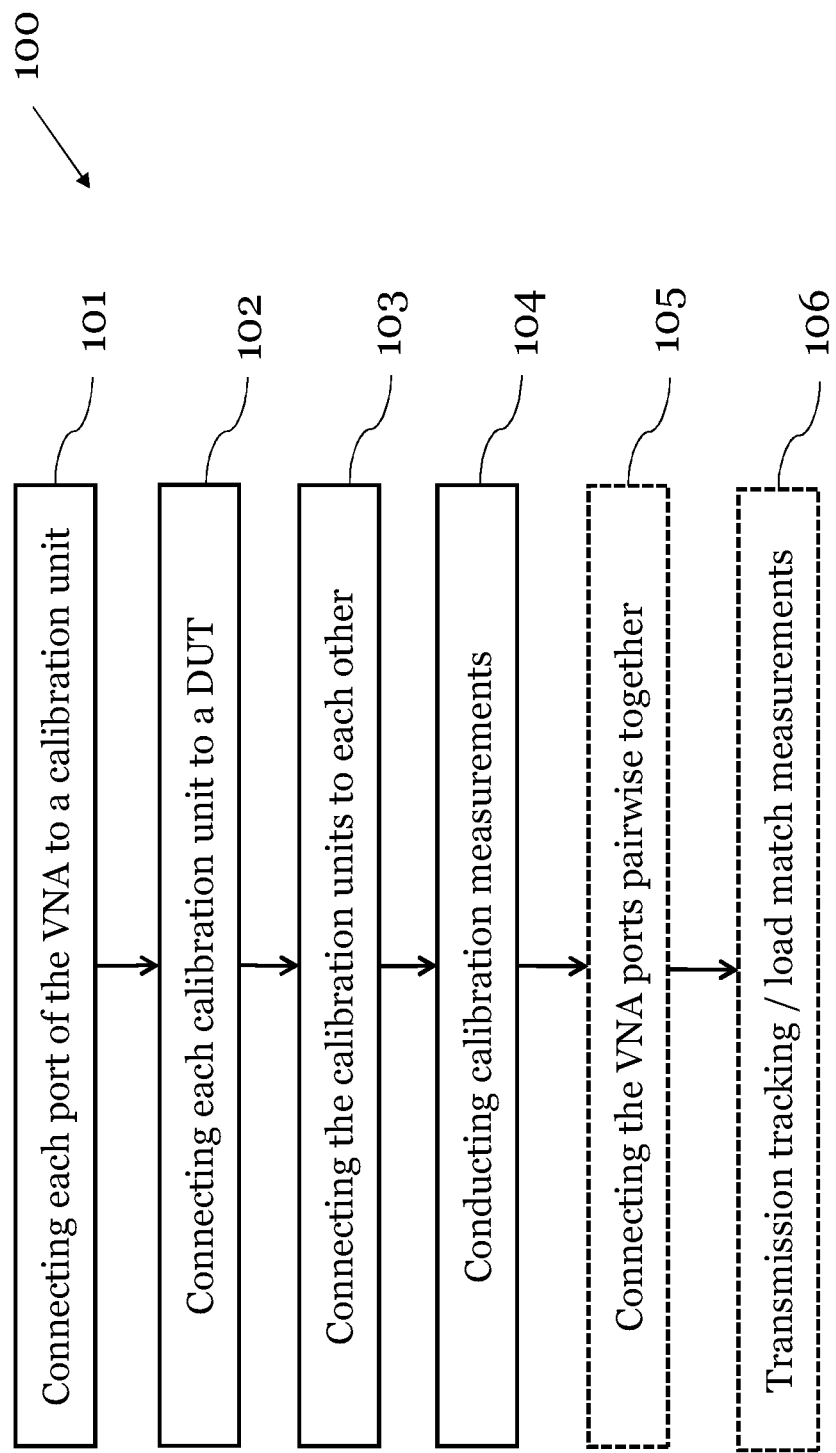
FIG. 8 shows a flow chart of a calibration method for a VNA according to an embodiment of this disclosure.

FIG. 8 shows a flow chart of a calibration method 100 for the VNA according to an embodiment. The VNA comprises a number of ports, e.g. N ports.

The calibration method 100 comprising the steps of: connecting 101 each port of the VNA to a respective calibration unit 10; connecting 102 each calibration unit 10 to a DUT; connecting 103 the calibration units 10 to each other; and conducting 104 calibration measurements with at least one of the calibration standards short, open and match simultaneously for each port of the VNA. In particular, the calibration units 10 apply the same calibration standard (open, short or match) to each port of the VNA and the calibration measurement with this standard is carried out simultaneously with this standard.

The calibration method 100 shown in FIG. 8 comprises the further optional steps of: connecting 105 the ports of the VNA pairwise together by means of the respective calibration units 10; and conducting 106 respective transmission tracking and/or load match measurements. The transmission tracking and/or load match measurements can be carried out for each respective pair of connected VNA ports.

The steps 104-106 form a calibration routine that can be carried out automatically by the calibration units once the connections according to steps 101-103 are established. Thus, the calibration units 10 can be automatic calibration units that form an automatic calibration setup. A user does not have to change any connections or wiring during or in-between the calibration routine (steps 104-106).

Thus, the calibration of the VNA can be done at least in part simultaneously. For example, each port of the VNA is connected to one calibration unit 10 and the open, short and match calibration can be done simultaneously for each port. The transmission tracking and load match calibration can be done at least in part simultaneously.

For example, in a system 60 as shown in FIG. 4 or 5, the transmission tracking and load match between calibration unit 10-1 and 10-2 can be done simultaneously with the transmission tracking and load match between inline calibration unit 10-3 and 10-4. However, the transmission tracking and load match between inline calibration unit 10-1 and 10-2 is done sequentially between transmission tracking and load match between calibration units 10-2 and 10-1, or between calibration units 10-1 and 10-3, or between calibration units 10-1 and 10-4.

The calibration measurements can be carried out over a specified temperature range and the acquired calibration data for each calibration measurement can be saved on the VNA and/or on the calibration device, e.g. on an EEPROM of the VNA, for performing a measurement calibration.

All features described above or features shown in the figures can be combined with each other in any advantageous manner within the scope of the disclosure.

The invention claimed is:

1. A calibration unit for a vector network analyzer (VNA), comprising:
   a calibration circuit which is configured to provide the calibration standards open, short and match; and
   an isolation circuit;
   wherein the calibration circuit comprises:
   a first port which is arranged for being connected to a port of the VNA,
   a second port which is arranged for being connected to a device-under-test (DUT), and
   a third port which is connected to a first port of the isolation circuit;
   wherein the isolation circuit comprises a second port which is arranged for being connected to one or more further calibration units.

2. The calibration unit of claim 1,
   wherein the calibration unit is configured to connect the first port of the calibration circuit to the second port of the isolation circuit in order to perform a transmission tracking and/or a load match measurement.

3. The calibration unit of claim 1,
   wherein the calibration circuit comprises a fourth port which is connected to a match calibration standard.

4. The calibration unit of claim 1,
   wherein the isolation circuit comprises a third port which is connected to a matched load.

5. The calibration unit of claim 1,
   wherein the calibration unit is configured to connect the first port of the calibration circuit to the short calibration standard, the open calibration standard, the match calibration standard, or the DUT; and
   wherein the calibration unit is configured to disconnect the first port of the isolation circuit from the second port of the isolation circuit.

6. The calibration unit of claim 4,
   wherein the calibration unit is configured to connect the first port of the isolation circuit to the third port of the isolation circuit.

7. The calibration unit of claim 4,
   wherein the calibration unit is configured to connect the first port of the calibration circuit to the second port of the calibration circuit; and
   wherein the calibration unit is further configured to connect the first port of the isolation circuit to the third port of the isolation circuit.

8. The calibration unit of claim 1, further comprising:
   a distribution unit;
   wherein the distribution unit comprises a first port which is connected to the second port of the isolation circuit; and
   wherein the distribution unit comprises at least a second and a third port;
   wherein the second port of the distribution unit is arranged for being connected to a first further calibration unit; and
   wherein the third port of the distribution unit is arranged for being connected to a second further calibration unit.

9. The calibration unit of claim 8,
   wherein the distribution unit comprises at least N ports, wherein N is the number of ports of the VNA.

10. The calibration unit of claim 9,
    wherein the at least N ports of the distribution unit comprise the first port which is connected to the second port of the isolation circuit, and N−1 further ports which are each arranged for being connected to a respective further calibration unit.

11. The calibration unit of claim 1, further comprising:
    a switch matrix;
    wherein the switch matrix has N ports, wherein N is the number of ports of the VNA;
    wherein a first port of the switch matrix is connected to the second port of the isolation circuit; and
    wherein the remaining ports of the switch matrix are arranged for being connected to the one or more further calibration units.

12. A calibration system for a VNA, wherein the VNA has N ports, the calibration system comprising:
    N calibration units according to claim 1; wherein:
    a) the first port of the calibration circuit of each of the N calibration units is arranged for being connected to one of the N ports of the VNA,
    b) the second port of the calibration circuit of each of the N calibration units is arranged for being connected to the DUT, and
    c) the third port of the calibration circuit of each of the N calibration units is connected to the first port of the respective isolation circuit of the calibration unit.

13. The calibration system of claim 12,
    wherein each of the N calibration units comprises a distribution unit;
    wherein each distribution unit comprises a first port which is connected to the second port of the isolation circuit of the respective calibration unit; and wherein each distribution unit further comprises at least a second and a third port via which the distribution unit is connected to the distribution units of two further calibration units of the N calibration units;

wherein the distribution units of the N calibration units are connected to each other in a ring like structure.

14. A set comprising a VNA and the calibration system of claim 12, wherein the calibration system is configured to control each of the N calibration units in such a way that each calibration unit subsequently connects the calibration standards open, short and match to a respective port of the VNA;

wherein the VNA is configured to conduct a respective measurement for each calibration standard connected to a respective port of the VNA, wherein the measurements with each calibration standard are conducted simultaneously for all ports of the VNA.

15. The set according to claim 14, wherein the calibration system is configured to connect the ports of the VNA pairwise together by means of the respective calibration units;

wherein the VNA is configured to conduct respective transmission track and/or load match measurements.

16. A calibration method for a vector network analyzer (VNA), wherein the VNA comprises a number of ports, the calibration method comprising the steps of:

connecting each port of the VNA to a respective calibration unit according to claim 1;

connecting each calibration unit to a device-under-test (DUT);

connecting the calibration units to each other; and conducting calibration measurements with at least one of the calibration standards short, open and match simultaneously for each port of the VNA.

17. The calibration method of claim 16, further comprising the steps of:

connecting the ports of the VNA pairwise together by means of the respective calibration units; and conducting respective transmission tracking and/or load match measurements.

\* \* \* \* \*